US012704549B2

(12) United States Patent
Luo et al.

(10) Patent No.: US 12,704,549 B2
(45) Date of Patent: Aug. 11, 2026

(54) SHUTDOWN DEVICE DETECTION AND CONTROL METHOD, AND DETECTOR

(71) Applicant: ALTENERGY POWER SYSTEM INC., Jiaxing (CN)

(72) Inventors: Yuhao Luo, Haining (CN); Dongming Zhou, Haining (CN); Xuan Zhu, Haining (CN); Wenwei Li, Haining (CN); Houkun Tan, Haining (CN); Zhenhuan Zhang, Haining (CN); Guowei Miao, Haining (CN)

(73) Assignee: ALTENERGY POWER SYSTEM INC., Jiaxing (CN)

( * ) Notice: Subject to any disclaimer, the term of this patent is extended or adjusted under 35 U.S.C. 154(b) by 158 days.

(21) Appl. No.: 18/686,891

(22) PCT Filed: Jan. 29, 2022

(86) PCT No.: PCT/CN2022/074882
§ 371 (c)(1),
(2) Date: Feb. 27, 2024

(87) PCT Pub. No.: WO2023/130522
PCT Pub. Date: Jul. 13, 2023

(65) Prior Publication Data

US 2025/0130280 A1 Apr. 24, 2025

(30) Foreign Application Priority Data

Jan. 10, 2022 (CN) ......................... 202210021586.4

(51) Int. Cl.
*G01R 31/327* (2006.01)
*H02J 3/388* (2026.01)
(Continued)

(52) U.S. Cl.
CPC .......... *G01R 31/3274* (2013.01); *H02J 3/388* (2020.01); *H02M 1/36* (2013.01); *H02S 50/00* (2013.01); *H02J 2101/24* (2026.01)

(58) Field of Classification Search
None
See application file for complete search history.

(56) References Cited

U.S. PATENT DOCUMENTS

2008/0310337 A1 12/2008 Welles
2019/0027617 A1* 1/2019 Varlan .................. H10F 77/955
(Continued)

FOREIGN PATENT DOCUMENTS

CN 102540070 A 7/2012
CN 104936255 A 9/2015
(Continued)

OTHER PUBLICATIONS

Luo Yuhao et al.; Shutoff detection method and detector; Publication Date Oct. 11, 2019; Haining Yuneng Electronics Co Ltd; Publication CN110320469A; CPC G01R31/3272 (Year: CPC) (Year: 2019).*
(Continued)

*Primary Examiner* — Nasima Monsur
(74) *Attorney, Agent, or Firm* — Yue (Robert) Xu; Apex Attorneys at Law, LLP

(57) ABSTRACT

A method for testing and controlling a rapid shutdown device, and a tester are provided. The method includes: transmitting a heartbeat signal of first signal strength to a target rapid shutdown device in a target rapid shutdown module to switch the target rapid shutdown device on and testing the target rapid shutdown device using a preset testing program t, on receipt of a rapid shutdown device testing request, where all rapid shutdown devices in the target rapid shutdown module are previously off; and transmitting a heartbeat signal of second signal strength to the
(Continued)

target rapid shutdown module to switch the rapid shutdown devices on or off, on receipt of a rapid shutdown device control request, where the first signal strength is lower than the second signal strength. The rapid shutdown devices can be tested and controlled efficiently, thereby effectively avoiding safety hazards and thus protecting workers.

11 Claims, 6 Drawing Sheets

(51) Int. Cl.

| | |
|---|---|
| ***H02M 1/36*** | (2007.01) |
| ***H02S 50/00*** | (2014.01) |
| *H02J 101/24* | (2026.01) |

(56) References Cited

U.S. PATENT DOCUMENTS

| | | | | |
|---|---|---|---|---|
| 2020/0106264 | A1* | 4/2020 | Yu | H02H 5/12 |
| 2021/0391710 | A1 | 12/2021 | Yang et al. | |
| 2023/0126969 | A1 | 4/2023 | Yang et al. | |

FOREIGN PATENT DOCUMENTS

| | | | |
|---|---|---|---|
| CN | 108736140 | A | 11/2018 |
| CN | 109087494 | A | 12/2018 |
| CN | 109428342 | A | 3/2019 |
| CN | 209028179 | U | 6/2019 |
| CN | 110320469 | A | 10/2019 |
| CN | 110365061 | A | 10/2019 |
| CN | 111478290 | A | 7/2020 |
| CN | 112671044 | A | 4/2021 |
| CN | 113285484 | A | 8/2021 |
| CN | 113489052 | A | 10/2021 |
| WO | 2010078303 | A2 | 7/2010 |

OTHER PUBLICATIONS

Shen Fei et al.; Photovoltaic system module control device; Publication Date Mar. 5, 2019; Zhejiang Yingda Weixin Electronics Co Ltd; Publication CN109428342A·; CPC H02J13/0062 (Year: 2019).*

The 1st Office Action regarding Chinese Patent Application No. CN202210021586.4, Mailing date: Mar. 19, 2024. English Translation Provided by http://globaldossier.uspto.gov.

International Search Report for PCT/CN2022/074882 mailed Oct. 10, 2022, ISA/CN.

* cited by examiner

SHUTDOWN DEVICE DETECTION AND CONTROL METHOD, AND DETECTOR

The present application is a national phase application of PCT international patent application No. PCT/CN2022/074882, filed on Jan. 29, 2022 which claims priority to Chinese Patent Application No. 202210021586.4, titled "METHOD FOR TESTING AND CONTROLLING RAPID SHUTDOWN DEVICE, AND TESTER", filed on Jan. 10, 2022 with the China National Intellectual Property Administration, all of which are incorporated herein by reference in their entireties.

FIELD

The present disclosure relates to the technical filed of distributed grid-connected photovoltaic power systems, and in particular to a method for testing and controlling a rapid shutdown device, and a tester.

BACKGROUND

Grid-connected photovoltaic power systems are developing at an incredibly rapid pace by virtue of renewability and cleaning of solar energy. Generally, in a photovoltaic system, a photovoltaic string including multiple photovoltaic modules connected in series is connected to an inverter by which direct current power is converted into alternating current power fed into a power grid. The photovoltaic modules connected in series generate high voltage direct current power, which is likely to result in safety and fire hazards. The photovoltaic system that is in operation necessitates the inverter being protected against electric arcs. That is, the inverter should be switched off immediately when an electric arc is detected.

A direct current cable that strings the photovoltaic modules still outputs high-voltage direct current power even though the inverter has been switched off, and thus is still hazardous. In order to completely avoiding the high-voltage direct current power, a rapid shutdown device is usually connected between the photovoltaic module and the inverter. That is, the photovoltaic module is connected in series with the rapid shutdown device, and then is connected to the inverter. In addition, a controller is provided to control the rapid shutdown device independently, to switch off the rapid shutdown device straightaway. Therefore, the voltage on the direct current cable can be reduced to be lower than a limit in safety. In order to cut off the output of the photovoltaic module effectively and straightaway in case of electric arc at the inverter, the controller sends a control signal to the rapid shutdown device through the direct current cable equipped with a magnetic ring in the conventional technology.

However, whether freshly installed rapid shutdown devices operate properly or not is unknown. In addition, rapid shutdown devices are plugged in and unplugged one by one, in order to locate a malfunctioning rapid shutdown device or part of the rapid shutdown devices including a malfunctioning rapid shutdown device, which is time-consuming. That is, the malfunctioning rapid shutdown device is located inefficiently. Moreover, the controller, when arranged inside the inverter, stops operating as the inverter is switched off, resulting in failure to control the rapid shutdown device. This is terribly dangerous.

In summary, how to efficiently test and control the rapid shutdown device is a technical problem to be solved urgently by those skilled in the art.

SUMMARY

A method for testing and controlling a rapid shutdown device, and a tester are provided according to the present application, to test and control the rapid shutdown devices efficiently, thereby effectively avoiding safety hazards and thus protecting workers.

In a first aspect, the method according to the present disclosure includes: transmitting a heartbeat signal of first signal strength to a target rapid shutdown device in a target rapid shutdown module to switch the target rapid shutdown device on and testing the target rapid shutdown device using a preset testing program to obtain a testing result, on receipt of a rapid shutdown device testing request, where all rapid shutdown devices in the target rapid shutdown module are previously off, and transmitting a heartbeat signal of second signal strength to the target rapid shutdown module to switch the rapid shutdown devices in the target rapid shutdown module on or off, on receipt of a rapid shutdown device control request, where the first signal strength is lower than the second signal strength.

Preferably, the transmitting the heartbeat signal of first signal strength to the target rapid shutdown device in the target rapid shutdown module includes: generating the heartbeat signal of the first signal strength by a communication component under control of a signal strength regulating component; and transmitting the heartbeat signal of the first signal strength to the target rapid shutdown device via an induction coil.

Preferably, the transmitting the heartbeat signal of second signal strength to the target rapid shutdown module includes: generating the heartbeat signal of the second signal strength by the communication component under control of the signal strength regulating component; and transmitting the heartbeat signal of the second signal strength to the target rapid shutdown module via a magnetic ring.

Preferably, the testing the target rapid shutdown device using the preset testing program to obtain the testing result includes: testing the target rapid shutdown device using a signal receiving function testing program to obtain the testing result for a signal receiving function, if the preset testing program is the signal receiving function testing program; testing the target rapid shutdown device using a signal analysis function testing program to obtain the testing result for a signal analysis function, if the preset testing program is the signal analysis function testing program; and testing the target rapid shutdown device using a rapid shutdown function testing program to obtain the testing result for a rapid shutdown function, if the preset testing program is the rapid shutdown function testing program.

Preferably, the testing the target rapid shutdown device using the signal receiving function testing program to obtain the testing result for the signal receiving function includes: transmitting a control signal to the target rapid shutdown device and acquiring a reaction signal from the target rapid shutdown device; determining whether the reaction signal is consistent with the control signal; determining that the signal receiving function of the target rapid shutdown device operates properly if determined that the reaction signal is consistent with the control signal; and determining that the signal receiving function of the target rapid shutdown device malfunctions if determined that the reaction signal is inconsistent with the control signal.

Preferably, the testing the target rapid shutdown device using the rapid shutdown function testing program to obtain the testing result for the rapid shutdown function includes: measuring a voltage outputted by the target rapid shutdown device or a module voltage corresponding to the target rapid shutdown device, by a voltage measuring component, to obtain voltage data; determining whether the voltage data is within a preset normal voltage range; determining that the rapid shutdown function of the target rapid shutdown device operates properly if determined that the voltage data is within the preset normal voltage range; and determining that the rapid shutdown function of the target rapid shutdown device malfunctions if determined that the voltage data is beyond the preset normal voltage range.

Preferably, the testing the target rapid shutdown device using the signal analysis function testing program to obtain the testing result for a signal analysis function includes: determining whether the voltage data matches the heartbeat signal of the first signal strength; determining that the signal analysis function of the target rapid shutdown device operates properly if determined that the voltage data matches the heartbeat signal of the first signal strength; and determining that the signal analysis function of the target rapid shutdown device malfunctions if determined that the voltage data does not match the heartbeat signal of the first signal strength.

Preferably, the method further includes: starting the preset testing program when a button is pressed before the testing the target rapid shutdown device using the preset testing program to obtain the testing result.

Preferably, the method further includes: displaying the testing result on a display screen after the testing result is obtained by testing the target rapid shutdown device using the preset testing program.

In a second aspect, a tester is further provided according to the present disclosure. The tester includes a main control chip, a communication component, a coupling device, a signal strength regulating component, a voltage measuring component, a functional testing button, and a display screen. The main control chip is connected to the communication component, the voltage measuring component, the functional testing button, and the display screen. The communication component is connected to the coupling device and the signal strength regulating component. Two probes of the voltage measuring component are configured to be positioned at an input port and an output port of a target rapid shutdown device respectively and the coupling device is configured to communicate with the target rapid shutdown device, for the tester to test the target rapid shutdown device. The coupling device is configured to communicate with a target rapid shutdown module for the tester to control rapid shutdown devices. The target rapid shutdown device is one of the rapid shutdown devices in the target rapid shutdown module.

In method for testing and controlling a rapid shutdown device according to the present disclosure. On receipt of a rapid shutdown device testing request, the heartbeat signal of the first signal strength is transmitted to the target rapid shutdown device in a target rapid shutdown module to switch the target rapid shutdown device on, and the target rapid shutdown device is tested using the preset testing program to obtain a testing result. All the rapid shutdown devices in the target rapid shutdown module are off previously. On receipt of a rapid shutdown device control request, the heartbeat signal of the second signal strength is transmitted to the target rapid shutdown module to switch all the rapid shutdown devices in the target rapid shutdown module on or off. The first signal strength is lower than the second signal strength.

With the technical solutions according to the present disclosure, on receipt of the rapid shutdown device testing request, the heartbeat signal of the first signal strength (low strength) is transmitted to the target rapid shutdown device, i.e., the to-be-tested rapid shutdown device, in the target rapid shutdown module to switch the target rapid shutdown device on. Then the target rapid shutdown device is tested using the preset testing program to obtain the testing result. With this method, the rapid shutdown devices can be tested more efficiently and the malfunction can be located rapidly compared with the conventional troubleshooting in which rapid shutdown devices are plugged in and unplugged manually. On receipt of the rapid shutdown device control request, the control signal of the second signal strength (high strength) is directly transmitted to the target rapid shutdown module to switch all the rapid shutdown devices in the target rapid shutdown module on or off, such that the rapid shutdown devices are controlled. With this method, the rapid shutdown devices can be efficiently controlled even though the controller arranged inside the inverter stops operating as the inverter is switch off, thereby effectively preventing safety hazards and thus protecting the system and workers.

The tester corresponding to the method for testing and controlling a rapid shutdown device is further provided according to the present disclosure. The tester includes a main control chip, a communication component, a coupling device, a signal strength regulating component, a voltage measuring component, a functional testing button, and a display screen. The main control chip is connected to the communication component, the voltage measuring component, the functional testing button, and the display screen. The communication component is connected to the coupling device and the signal strength regulating component. Two probes of the voltage measuring component are configured to be positioned at an input port and an output port of a target rapid shutdown device respectively and the coupling device is configured to communicate with the target rapid shutdown device, for the tester to test the target rapid shutdown device. The coupling device is configured to communicate with a target rapid shutdown module for the tester to control rapid shutdown devices. The target rapid shutdown device is one of the rapid shutdown devices in the target rapid shutdown module.

The tester includes the above components connected as described above. The tester can implement the steps of the method for testing and controlling a rapid shutdown device. That is, the tester can test and control the rapid shutdown devices. The rapid shutdown devices can be tested more efficiently and the malfunction can be located rapidly compared with the conventional troubleshooting in which rapid shutdown devices are plugged in and unplugged manually. Further, the rapid shutdown devices can be efficiently controlled even though the controller arranged inside the inverter stops operating as the inverter is switch off, thereby effectively preventing safety hazards and thus protecting the system and workers.

BRIEF DESCRIPTION OF THE DRAWINGS

In order to more clearly describe technical solutions in the conventional technology and in the embodiments of the present disclosure, drawings to be used in the description of the conventional technology and the embodiments of the present disclosure are briefly introduced hereinafter. It is apparent that the drawings described below illustrates merely the embodiments of the present disclosure, and those skilled in the art can obtain other drawings based on the provided drawings without any creative effort. All the obtained drawings fall within the protection scope of the present disclosure.

DETAILED DESCRIPTION OF THE EMBODIMENTS

A method for testing and controlling a rapid shutdown device, and a tester are provided according to the present disclosure, to test and control the rapid shutdown device efficiently, thereby effectively avoiding safety hazards and protecting workers.

In order to clearly and completely describe the technical solutions in the embodiments in the present disclosure, the technical solutions in the embodiments of the present disclosure will be described below in conjunction with the drawings of the embodiments of the present disclosure. Apparently, the embodiments described below are only some embodiments of the present disclosure, rather than all the embodiments. Any other embodiments obtained by those skilled in the art based on the embodiments in the present disclosure without any creative effort fall within the protection scope of the present disclosure.

A method for testing and controlling a rapid shutdown device is provided according to embodiments of the present disclosure.

In order to facilitate better understanding of the technical solutions according to the embodiments of the present disclosure by those skilled in the art, application scenarios to which the technical solutions according to the embodiments of the present disclosure are applicable are described in detail below.

Figure 1:
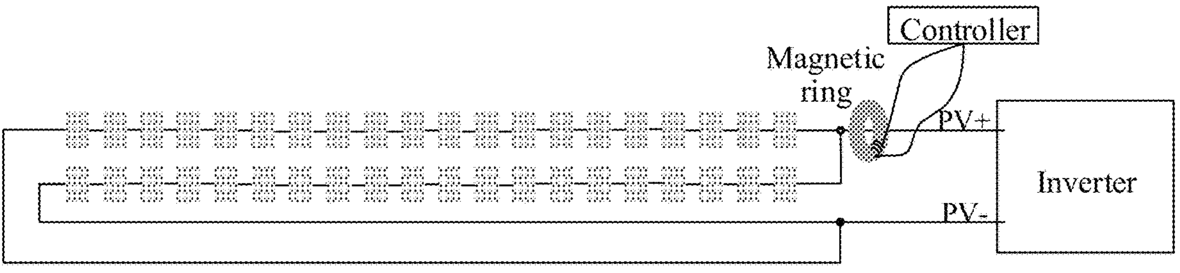
FIG. 1 is a schematic structural diagram illustrating a photovoltaic system.

FIG. 1 is a schematic structural diagram illustrating a photovoltaic system. Photovoltaic modules (for example, solar panels as shown in FIG. 1) are connected to respective rapid shutdown devices (not shown in FIG. 1), and then are connected to an inverter. A controller transmits a control signal to a PV bus via a magnetic ring. In this embodiment, the rapid shutdown devices are tested.

Figure 2:
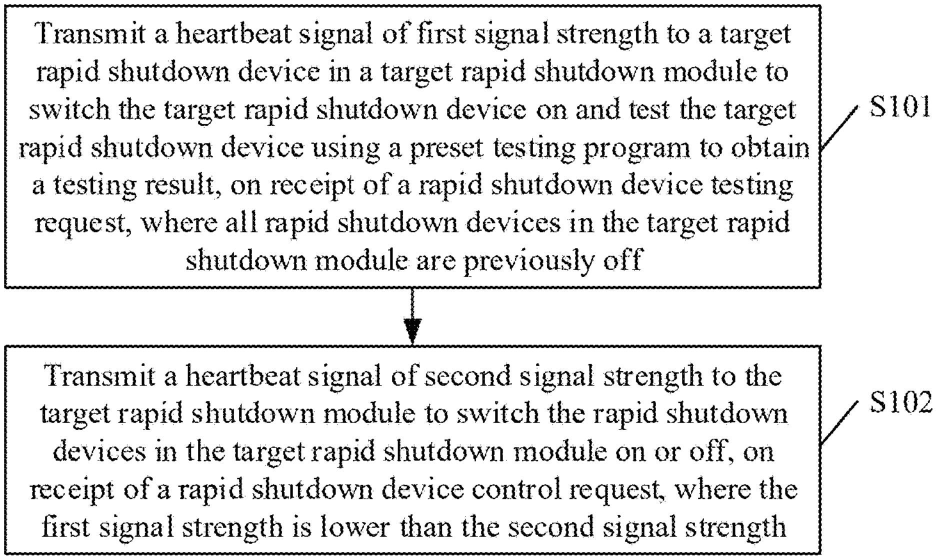
FIG. 2 is a flowchart illustrating a method for testing and controlling a rapid shutdown device according to the present disclosure.

FIG. 2 is a flowchart illustrating the method for testing and controlling a rapid shutdown device according to the present disclosure. The method is applicable to a testing device, for example, the tester according to the present disclosure. The method includes the following steps S101 and S102.

In step S101, on receipt of a rapid shutdown device testing request, a heartbeat signal of first signal strength is transmitted to a target rapid shutdown device in a target rapid shutdown module to switch the target rapid shutdown device on, and the target rapid shutdown device is tested by executing a preset testing program to obtain a testing result. All rapid shutdown devices in the target rapid shutdown module are off previously.

Step S101 is performed to test the rapid shutdown devices.

Here the tester being started indicates that the rapid shutdown device testing request is received. In some embodiments, the rapid shutdown device testing request is an instruction inputted by a user on an operating panel. Alternatively, the rapid shutdown device testing request is an instruction transmitted by other device, for example, a master control device (communicating with the tester). In other embodiments, the rapid shutdown device testing request is an instruction automatically generated in response to a preset condition (for example, in due time). Details about the rapid shutdown device testing request are not limited in the present disclosure.

On receipt of the rapid shutdown device testing request, the heartbeat signal of the first signal strength is transmitted to the target rapid shutdown device in the target rapid shutdown module to switch the target rapid shutdown device on. The target rapid shutdown device refers to a rapid shutdown device that is to be tested. The to-be-tested rapid shutdown device is one of the rapid shutdown devices in the target rapid shutdown module. The target rapid shutdown module may include multiple rapid shutdown devices. All the rapid shutdown devices in the target rapid shutdown module are tested by the tester, and thus the target rapid shutdown module is tested. That is, the rapid shutdown devices in the target rapid shutdown module each are determined as the target rapid shutdown device sequentially during the testing. In addition, the first signal strength is preset depending on actual conditions. The tester performs functional testing on the rapid shutdown devices singly, and therefore the first signal strength is relatively low to effectively prevent interference with other rapid shutdown devices.

Further, the preset testing program is started as soon as the target rapid shutdown device is started in response to the received heartbeat signal, then test automation is performed on the target rapid shutdown device by use of the preset testing program. In this way, the rapid shutdown device is subjected to the functional testing, which involves various functions of the rapid shutdown device. In view of this, various testing programs are pre-written for these functions.

It should be noted that all the rapid shutdown devices in the target rapid shutdown module are off, that is, do not operate, previous to the functional testing on the target rapid shutdown device. To perform the functional testing on the target rapid shutdown device, the heartbeat signal of the first signal strength is transmitted to the target rapid shutdown device to switch the target rapid shutdown device on. That is, only the target rapid shutdown device in the target rapid shutdown module is switched on, and the remaining rapid shutdown devices in the target rapid shutdown module are still off for preventing interference with the testing. In this way, the target rapid shutdown device can be tested accurately.

In step S102, on receipt of a rapid shutdown device control request, a heartbeat signal of second signal strength is transmitted to the target rapid shutdown module to switch the rapid shutdown devices in the target rapid shutdown module on or off. The first signal strength is lower than the second signal strength.

Step S102 is performed to control the rapid shutdown devices.

Similarly, the tester being started indicates that the rapid shutdown device control request is received. In some embodiments, the rapid shutdown device control request is an instruction inputted by a user on an operating panel.

Alternatively, the rapid shutdown device control request is an instruction transmitted by another device, for example, a master control device (communicating with the tester). In other embodiments, the rapid shutdown device control request is an instruction automatically generated in response to a preset condition (for example, in due time). Details about the rapid shutdown device control request are not limited in the present disclosure. The rapid shutdown device control request instructs the rapid shutdown devices in the target rapid shutdown module to switch from on state to off state or from off state to on state.

On receipt of the rapid shutdown device control request, the heartbeat signal of the second signal strength is directly transmitted to the target rapid shutdown device to switch the rapid shutdown devices in the target rapid shutdown module on or off, such that the rapid shutdown devices are controlled. The second signal strength is preset depending on actual conditions. The tester controls the entire rapid shutdown module, and therefore the second signal strength is relatively high. That is, the second signal strength is higher than the first signal strength.

It can be seen that in the method for testing and controlling a rapid shutdown device according to the present disclosure, on receipt of the rapid shutdown device testing request, the heartbeat signal of the first signal strength (low strength) is transmitted to the target rapid shutdown device, i.e., the to-be-tested rapid shutdown device, in the target rapid shutdown module to switch the target rapid shutdown device on. Then the target rapid shutdown device is tested using the preset testing program to obtain a testing result. With this method, the rapid shutdown devices can be tested more efficiently and the malfunction can be located rapidly compared with the conventional troubleshooting in which rapid shutdown devices are plugged in and unplugged manually. On receipt of the rapid shutdown device control request, a control signal of the second signal strength (high strength) is directly transmitted to the target rapid shutdown module to switch all the rapid shutdown devices in the target rapid shutdown module on or off, such that the rapid shutdown devices are controlled. With this method, the rapid shutdown devices can be efficiently controlled even though the controller arranged inside the inverter stops operating as the inverter is switch off, thereby effectively preventing safety hazards and thus protecting the system and workers.

In an embodiment of the present disclosure, the heartbeat signal of the first signal strength is transmitted to the target rapid shutdown device in the target rapid shutdown module as follows. A communication component generates the heartbeat signal of the first signal strength under control of a strength regulating component. The heartbeat signal of the first signal strength is transmitted to the target rapid shutdown device via an induction coil.

Figure 3:
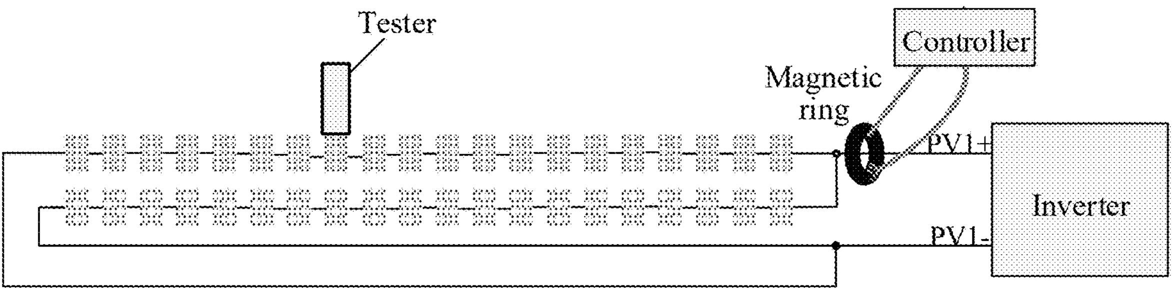
FIG. 3 is a schematic diagram illustrating a disposition of a tester according to the present disclosure.

In the embodiments of the present disclosure, the heartbeat signal for testing the rapid shutdown device is transmitted as follows. The tester is provided with the signal strength regulating component, the communication component and the induction coil. The communication component is configured to generate the heartbeat signal. The signal strength regulating component is configured to regulate strength of the heartbeat signal. The induction coil is configured for transmitting the heartbeat signal. First, the signal strength regulating component controls the communication component to generate the heartbeat signal of the first signal strength, which is then transmitted to the target rapid shutdown device via inductive coupling of the induction coil. Since the rapid shutdown devices are tested singly, as long as the heartbeat signal is received by the target rapid shutdown device. In view of this, the tester generates the heartbeat signal of low signal strength, and is positioned in the proximity of the target rapid shutdown device to be inductively coupled with the target rapid shutdown device for transmitting the heartbeat signal. For example, FIG. 3 is a schematic diagram illustrating a disposition of the tester according to the present disclosure.

In an embodiment of the present disclosure, the heartbeat signal of the second signal strength is transmitted to the target rapid shutdown module as follows. The communication component generates the heartbeat signal of the second signal strength under control of the signal strength regulating component. The heartbeat signal of the second signal strength is transmitted to the target rapid shutdown module via a magnetic ring.

Figure 4:
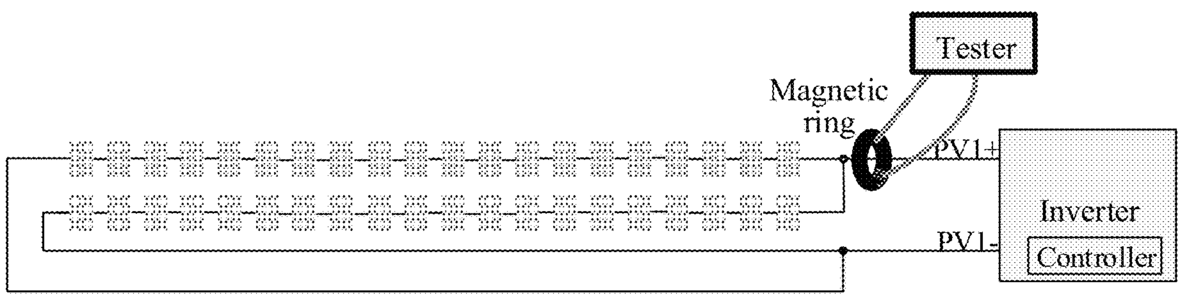
FIG. 4 is a schematic diagram illustrating another disposition of the tester according to the present disclosure.

In the embodiments of the present disclosure, the heartbeat signal for controlling the rapid shutdown devices is transmitted as follows. The tester is provided with the signal strength regulating component, the communication component and the induction coil. The communication component generates the heartbeat signal of the second signal strength under control of the signal strength regulating component. Further, as shown in FIG. 2, a magnetic ring is arranged on the PV bus, and thus the heartbeat signal of the second signal strength is transmitted to the target rapid shutdown module via the magnetic ring. In order to control the entire rapid shutdown module, i.e., the multiple rapid shutdown devices the heartbeat signal is to be received by all the multiple rapid shutdown devices. In view of this, the tester generates the heartbeat signal of high signal strength and is arranged in the proximity of the magnetic ring on the PV bus to transmit the heartbeat signal via the magnetic ring. For example, FIG. 4 is a schematic diagram illustrating another disposition of the tester according to the present disclosure.

In an embodiment of the present disclosure, the target rapid shutdown device is tested using the preset testing program to obtain the testing result as follows. In a case that the preset testing program is a signal receiving function testing program, the target rapid shutdown device is tested using the signal receiving function testing program to obtain the testing result for a signal receiving function. In a case that the preset testing program is a signal analysis function testing program, the target rapid shutdown device is tested using the signal analysis function testing program to obtain the testing result for a signal analysis function. In a case that the preset testing program is a rapid shutdown function testing program, the target rapid shutdown device is tested using the rapid shutdown function testing program to obtain the testing result for a rapid shutdown function.

In the embodiments of the present disclosure, various functions are tested. That is, the target rapid shutdown device is tested in terms of the signal receiving function, the signal analysis function and the rapid shutdown function. Therefore, the preset testing program includes the signal receiving function testing program, the signal analysis function testing program, and the rapid shutdown function testing program, for testing the corresponding functions.

In an embodiment of the present disclosure, the method further includes: starting the preset testing program when a button is pressed, before testing the target rapid shutdown device using the preset testing program to obtain the testing result.

In the method according to the embodiments of the present disclosure, these functions are selectively tested. That is, one or more or even all the functions are selected through a button on the tester, depending on actual conditions. The tester monitors in real time whether the button is pressed and then starts the corresponding testing program to test the rapid shutdown device and obtain the testing result.

In an embodiment of the present disclosure, three buttons are provided for the three functions respectively, to test the target rapid shutdown device accordingly. In other embodiments of the present disclosure, only one button is provided to start theses testing programs depending on how the button has been pressed. For example, a testing program corresponding to a function A is executed when the button is long pressed, and a testing program corresponding to a function B is executed when the button is pressed.

In an embodiment of the present disclosure, the target rapid shutdown device is tested using the signal receiving function testing program to obtain the testing result for the signal receiving function as follows. A control signal is transmitted to the target rapid shutdown device and a reaction signal from the target rapid shutdown device is received. It is determined whether the induction signal is consistent with the control signal. It is determined that the signal receiving function of the target rapid shutdown device operates properly if determined that the reaction signal is consistent with the control signal. It is determined the signal receiving function of the target rapid shutdown device malfunctions if determined that the reaction signal is inconsistent with the control signal.

Figure 5:
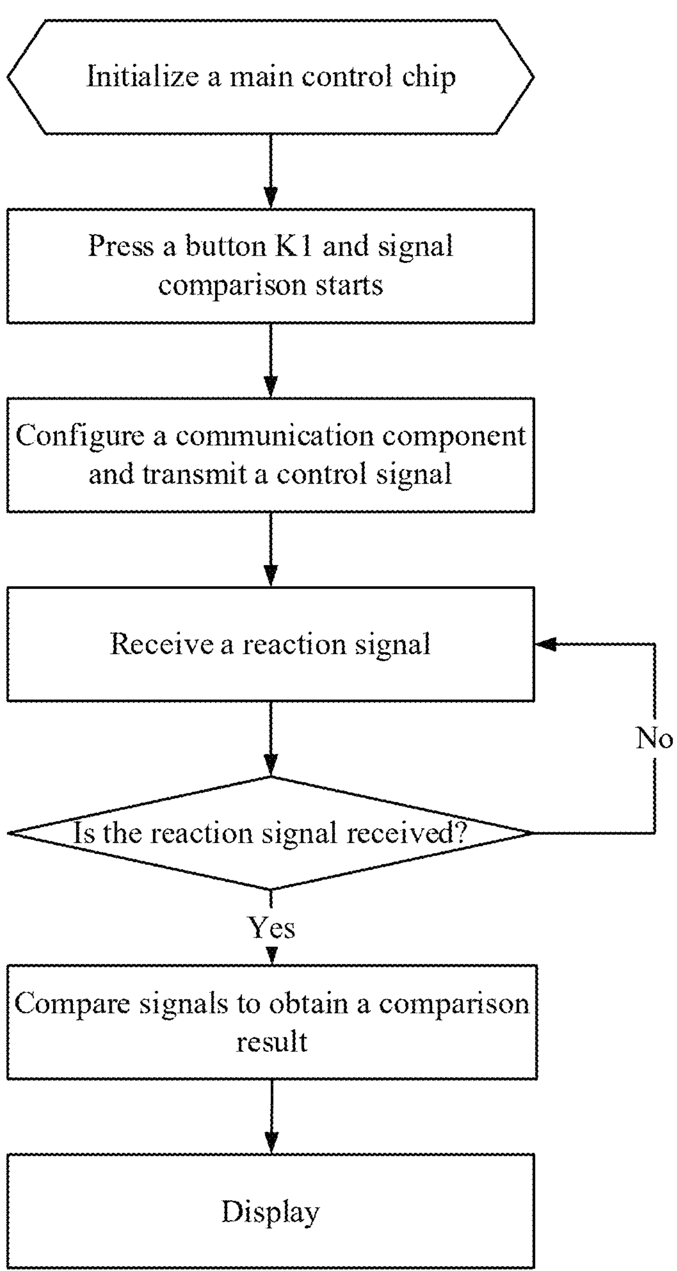
FIG. 5 is a flowchart illustrating testing on a signal receiving function according to the present disclosure.

In order to facilitate better understanding of the present disclosure, further details are described below with reference to FIG. 5, which is a flowchart illustrating testing on the signal receiving function according to the present disclosure.

A button K1 corresponds to the signal receiving function. After a main control chip is initialized, signal comparison starts. First, a control signal is transmitted to the target rapid shutdown device (by the tester directly or a controller under control of the tester). The target rapid shutdown device generates a reaction signal on receipt of the control signal. The communication component and induction coil are started to acquire the reaction signal. Then, the communication component sends the reaction signal to a central processor, such as a main control chip, of the tester. The main control chip compares the reaction signal with the control signal. For example, the main control chip determines whether the reaction signal matches the control signal in terms of signal parameters such as values and phases. It is determined based on the comparison result whether the signal receiving function of the target rapid shutdown device operates properly.

In an embodiment of the present disclosure, the target rapid shutdown device is tested using the rapid shutdown function testing program to obtain the testing result for the rapid shutdown function as follows. A voltage measuring component measures a voltage outputted by the target rapid shutdown device or a module voltage corresponding to the target rapid shutdown device to obtain voltage data. It is determined whether the voltage data is within a preset normal voltage range. It is determined that the rapid shutdown function of the target rapid shutdown device operates properly if determined that the voltage data is within the preset normal voltage range. It is determined that the rapid shutdown function of the target rapid shutdown device malfunctions if determined that the voltage data is not within the preset normal voltage range.

Figure 6:
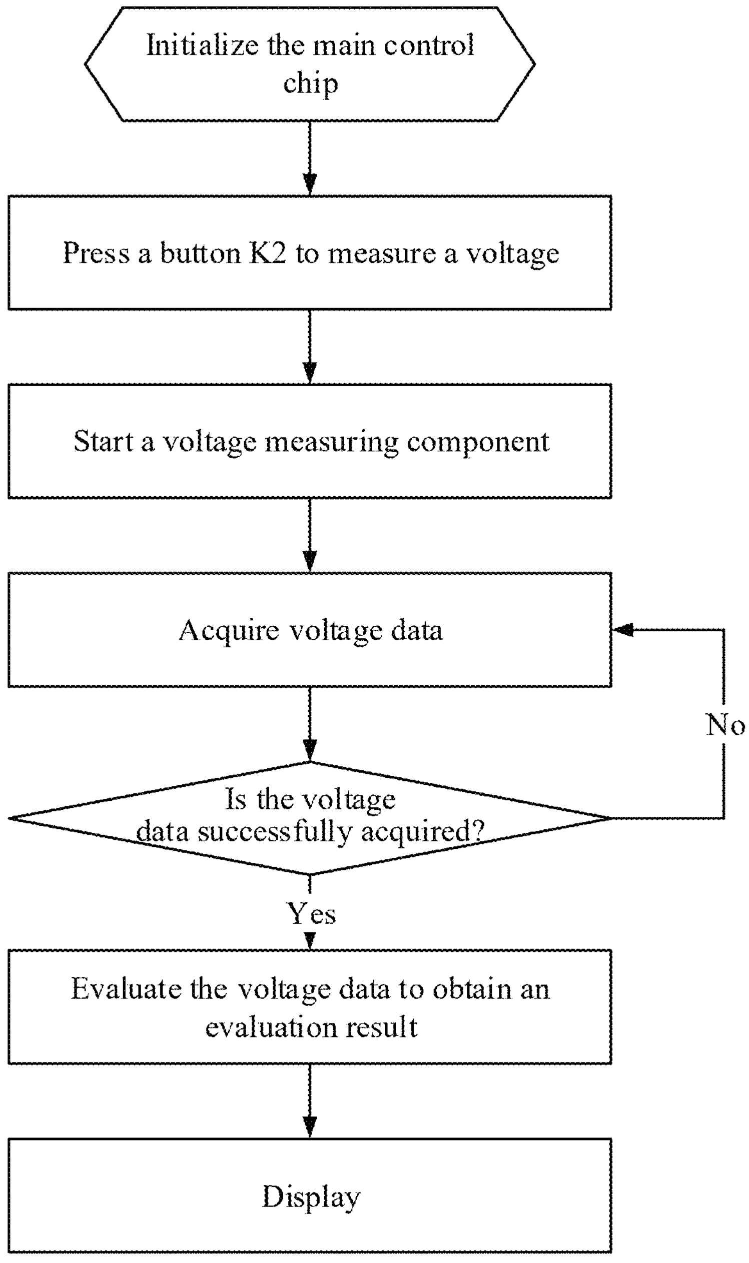
FIG. 6 is a flowchart illustrating testing on a rapid shutdown function according to the present disclosure.

In order to facilitate better understanding of the present disclosure, further details are described below with reference to FIG. 6, which is a flowchart illustrating testing on the rapid shutdown function according to the present disclosure.

A button K2 corresponds to the rapid shutdown function. After the main control chip is initialized, the voltage is measured. That is, the voltage measuring component measuring the corresponding voltage to obtain the voltage data, and sends the voltage data to the central processor, e.g., the main control chip, of the tester. The main control chip compares the voltage data with a preset voltage range. It is determined based on the comparison result whether the rapid shutdown function of the target rapid shutdown device operates properly.

In an embodiment of the present disclosure, the target rapid shutdown device is tested using the signal analysis function testing program to obtain the testing result for the signal analysis function as follows. It is determined whether voltage data matches the heartbeat signal of the first signal strength. It is determined the signal analysis function of the target rapid shutdown device operates properly if determined that the voltage data matches the heartbeat signal of the first signal strength. It is determined the signal analysis function of the target rapid shutdown device malfunctions if determined that the voltage data does not match the heartbeat signal of the first signal strength.

Figure 7:
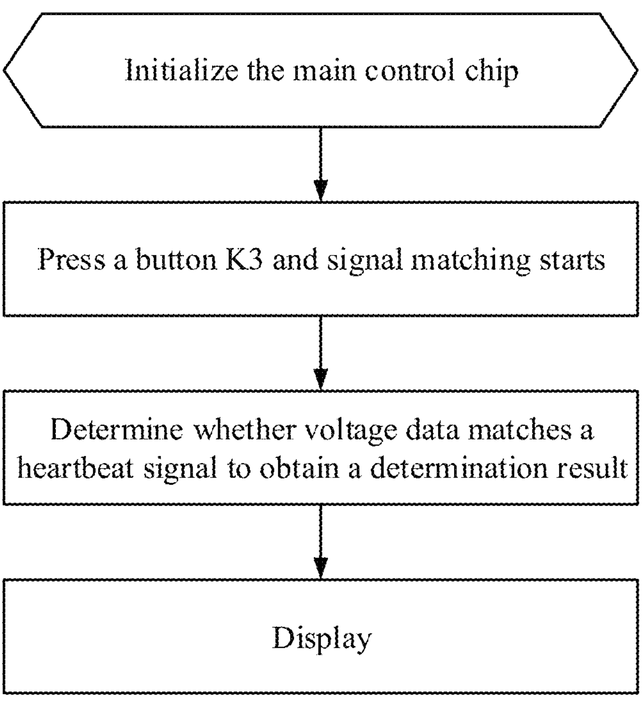
FIG. 7 is a flowchart illustrating testing on a signal analysis function according to the present disclosure.

In order to facilitate better understanding of the present disclosure, further details are described below with reference to FIG. 7, which is a flowchart illustrating testing on the signal analysis function according to the present disclosure.

A button K3 corresponds to the signal analysis function. After the main control chip is initialized, whether the voltage matches the heartbeat signal is determined. After the voltage data is obtained as described in the previous embodiment, it is determined whether the voltage data matches the heartbeat signal of the first signal strength. It is determined based on the matching result whether the signal analysis function of the target rapid shutdown device operates properly.

In an embodiment of the present disclosure, the method further includes: displaying the testing result on a display screen after the testing result is obtained by testing the target rapid shutdown device using the preset testing program.

The testing result is transmitted to the display screen and displayed on the display screen, and therefore is visualized. In an embodiment of the present disclosure, the testing result, when indicating a fault, is highlighted, and therefore the fault or malfunction can be located immediately.

Figure 8:
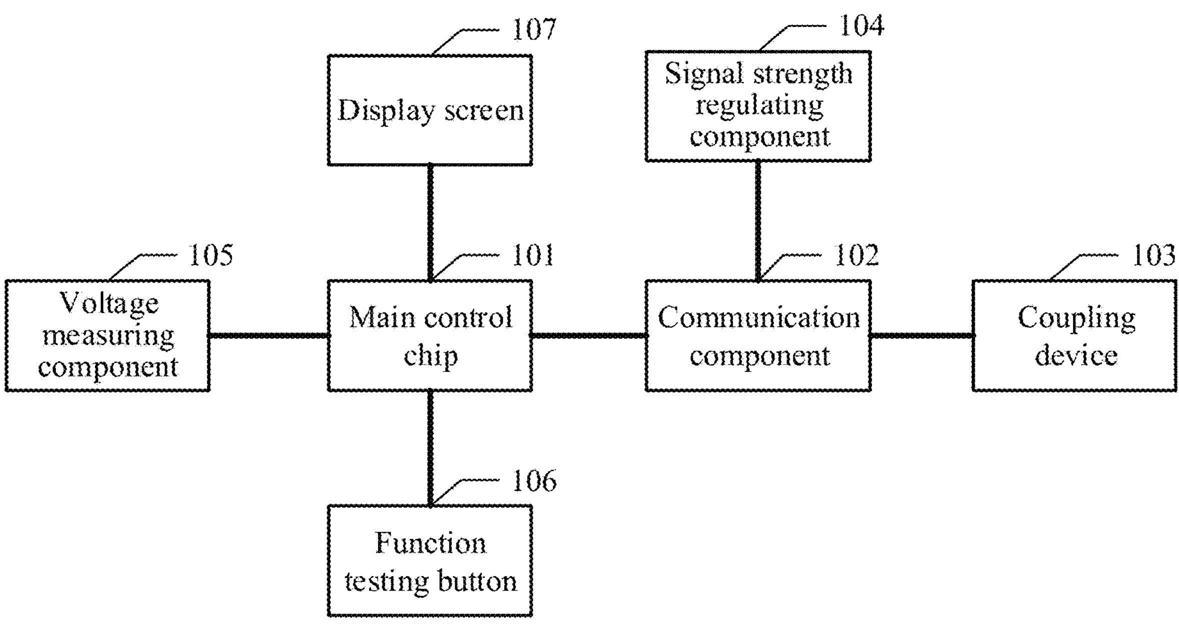
FIG. 8 is a schematic structural diagram illustrating a tester according to the present disclosure.

A tester is further provided according to the present disclosure. FIG. 8 is a schematic structural diagram illustrating the tester according to the present disclosure.

The tester includes a main control chip 101, a communication component 102, a coupling device 103, a signal strength regulating component 104, a voltage measuring component 105, a functional testing button 106, and a display screen 107.

The main control chip 101 is connected to the communication component 102, the voltage measuring component 105, the functional testing button 106, and the display screen 107. The communication component 102 is connected to the coupling device 103 and the signal strength regulating component 104.

To test a target rapid shutdown device, two probes of the voltage measuring component 105 are positioned at an input port and an output port of the target rapid shutdown device respectively, and the coupling device 103 communicates with the target rapid shutdown device.

To control rapid shutdown devices, the coupling device 103 communicates with the target rapid shutdown device. The target rapid shutdown device is one of the rapid shutdown devices in a target rapid shutdown module.

Only one functional testing button 106 is drawn in FIG. 8. In practice, multiple functional testing buttons may be provided for respective functions. For example, in an embodiment, the functional testing button 106 includes a signal receiving function testing button, a signal analysis function testing button, and a rapid shutdown function testing button. Accordingly, the main control chip 101 stores testing program corresponding to the function testing button 106. The function corresponding to a testing program is tested when the testing program is executed.

The main control chip 101 is an MCU chip, for example.

The coupling device is one of an induction coil, a magnetic ring, a capacitor and a transformer.

In an embodiment, the coupling device is the induction coil. The PV bus corresponding to the to-be-tested rapid shutdown device passes through the induction coil. The magnetic flux regarding the induction coil changes under an action of a control signal for synchronous alignment. The change in the magnetic flux acts on the PV bus, and then the PV bus generates a control signal corresponding to the heartbeat signal and sends the control signal to the rapid shutdown device. Acquisition of the control signal is the reverse. That is, a signal transmitted through the PV bus changes, which results in a change in the magnetic flux regarding the induction coil, so as to obtain the corresponding control signal. The magnetic ring functions similarly to the induction coil.

In an embodiment, the coupling device is the capacitor. The capacitor is connected in parallel to the PV bus corresponding to the to-be-tested rapid shutdown device. The capacitor is charged and discharged alternately under an action of the heartbeat signal, and thus a voltage across the capacitor is changing, for the PV bus to generate a control signal corresponding to the heartbeat signal and transmits the control signal to the rapid shutdown device. Acquisition of the control signal by the rapid shutdown device is the reverse. That is, the capacitor is charged and discharged alternately under the charging signal transmitted through the PV bus, and thus the voltage across the capacitor is changing, to obtain the control signal.

In an embodiment, the coupling device is the transformer. The transformer is connected in parallel to the PV bus corresponding to the to-be-tested rapid shutdown device. The transformer changes voltage constantly under the heartbeat signal, so that the PV bus generates a control signal corresponding to the heartbeat signal and outputs the control signal to the rapid shutdown device. Acquisition of the control signal by the rapid shutdown device is the reverse. That is, a changing signal transmitted through the PV bus results in the changing voltage inputted to the transformer, to obtain the control signal.

It can be seen that the tester according to the present disclosure includes the components connected as described above. The tester can implement the steps of the method for testing and controlling a rapid shutdown device. That is, the tester can test and control the rapid shutdown devices. The rapid shutdown devices can be tested more efficiently and the malfunction can be located rapidly compared with the conventional troubleshooting in which rapid shutdown devices are plugged in and unplugged manually. Further, the rapid shutdown devices can be efficiently controlled even though the controller arranged inside the inverter stops operating as the inverter is switch off, thereby effectively preventing safety hazards and thus protecting the system and workers.

A computer-readable storage medium storing a computer program is further provided according to the present disclosure. The computer program, when being executed by a processor, implements the method for testing and controlling a rapid shutdown device.

The computer-readable storage medium is a medium storing program codes, such as a U disk, a mobile hard disk, a read-only memory (ROM), a random access memory (RAM), a magnetic disk or an optical disk.

For description of the computer-readable storage medium according to the present disclosure, reference can be made to the above method embodiments. Therefore, the computer-readable storage medium is not detailed herein.

The embodiments in the specification are described in a progressive manner. Each of the embodiments mainly focuses on differences from other embodiments, and references can be made to each other for the same or similar parts among the embodiments. Since the device disclosed in the embodiments corresponds to the method disclosed in the embodiments, the description for the device is simple, and reference can be made to the method described in the embodiments for the relevant parts.

It should be further understood by those skilled in the art that units and algorithm steps in the examples described in conjunction with the embodiments disclosed herein may be implemented by electronic hardware, computer software or a combination thereof. In order to clearly describe interchangeability of the hardware and the software, the units and the steps in the examples are generally described above according to functionalities. Whether the functionalities are implemented by hardware or software depends on specific applications and design constraints for the technical solutions. Those skilled in the art can implement the described functions for each particular application with different methods, none of which is regarded as departing from the scope of the present disclosure.

Steps of the method or algorithm described in the embodiments disclosed herein may be directly implemented by hardware, a software module executable by a processor, or a combination thereof. The software module may be arranged in a storage medium known in the art, such as a random access memory (RAM), a memory, a read-only memory (ROM), an electrically programmable ROM, an electrically erasable programmable ROM, a register, a hard disk, a removable disk, and a CD-ROM.

The technical solutions according to the present disclosure are described in detail above. The principle and the embodiments of the present disclosure are described by specific examples. The above embodiments are described to facilitate understanding the method and the core idea of the present disclosure. It should be noted that, various improvements and modifications may be made to the present disclosure by those skilled in the art without departing from the principle of the present disclosure, and the improvements and modifications should fall within the protection scope of the present disclosure.

The invention claimed is:

1. A method for testing and controlling a rapid shutdown device, comprising:

transmitting a heartbeat signal of first signal strength to only a single target rapid shutdown device in a target rapid shutdown module and testing the target rapid shutdown device using a preset testing program to obtain a testing result, on receipt of a rapid shutdown device testing request, wherein all rapid shutdown devices in the target rapid shutdown module are previously off, and the heartbeat signal of the first signal strength is configured for switching the target rapid shutdown device on; and transmitting a heartbeat signal of second signal strength to the target rapid shutdown module, on receipt of a rapid shutdown device control request, wherein the first signal strength is lower than the second signal strength, and the heartbeat signal of the second signal strength is configured for switching to switch all the rapid shutdown devices in the target rapid shutdown module on or off.

2. The method according to claim 1, wherein the transmitting the heartbeat signal of first signal strength to the target rapid shutdown device in the target rapid shutdown module comprises:

generating the heartbeat signal of the first signal strength by a communication component under control of a signal strength regulating component; and transmitting the heartbeat signal of the first signal strength to the target rapid shutdown device via an induction coil.

3. The method according to claim 2, wherein the transmitting the heartbeat signal of second signal strength to the target rapid shutdown module comprises:

generating the heartbeat signal of the second signal strength by the communication component under control of the signal strength regulating component; and transmitting the heartbeat signal of the second signal strength to the target rapid shutdown module via a magnetic ring.

4. The method according to claim 1, wherein the testing the target rapid shutdown device using the preset testing program to obtain the testing result comprises:

testing the target rapid shutdown device using a signal receiving function testing program to obtain the testing result for a signal receiving function, if the preset testing program is the signal receiving function testing program;

testing the target rapid shutdown device using a signal analysis function testing program to obtain the testing result for a signal analysis function, if the preset testing program is the signal analysis function testing program; and testing the target rapid shutdown device using a rapid shutdown function testing program to obtain the testing result for a rapid shutdown function, if the preset testing program is the rapid shutdown function testing program.

5. The method according to claim 4, wherein the testing the target rapid shutdown device using the signal receiving function testing program to obtain the testing result for the signal receiving function comprises:

transmitting a control signal to the target rapid shutdown device and acquiring a reaction signal from the target rapid shutdown device;

determining whether the reaction signal is consistent with the control signal;

determining that the signal receiving function of the target rapid shutdown device operates properly if determined that the reaction signal is consistent with the control signal; and determining that the signal receiving function of the target rapid shutdown device malfunctions if determined that the reaction signal is inconsistent with the control signal.

6. The method according to claim 4, wherein the testing the target rapid shutdown device using the rapid shutdown function testing program to obtain the testing result for the rapid shutdown function comprises:

measuring a voltage outputted by the target rapid shutdown device or a module voltage corresponding to the target rapid shutdown device, by a voltage measuring component, to obtain voltage data;

determining whether the voltage data is within a preset normal voltage range;

determining that the rapid shutdown function of the target rapid shutdown device operates properly if determined that the voltage data is within the preset normal voltage range; and determining that the rapid shutdown function of the target rapid shutdown device malfunctions if determined that the voltage data is beyond the preset normal voltage range.

7. The method according to claim 6, wherein the testing the target rapid shutdown device using the signal analysis function testing program to obtain the testing result for a signal analysis function comprises:

determining whether the voltage data matches the heartbeat signal of the first signal strength;

determining that the signal analysis function of the target rapid shutdown device operates properly if determined that the voltage data matches the heartbeat signal of the first signal strength; and determining that the signal analysis function of the target rapid shutdown device malfunctions if determined that the voltage data does not match the heartbeat signal of the first signal strength.

8. The method according to claim 4, further comprising:

starting the preset testing program when a button is pressed before the testing the target rapid shutdown device using the preset testing program to obtain the testing result.

9. The method according to claim 1, further comprising:

displaying the testing result on a display screen after the testing result is obtained by testing the target rapid shutdown device using the preset testing program.

10. A tester, comprising:

a main control chip;

a communication component;

a coupling device;

a signal strength regulating component;

a voltage measuring component;

a functional testing button; and a display screen, wherein the main control chip is connected to the communication component, the voltage measuring component, the functional testing button, and the display screen;

the communication component is connected to the coupling device and the signal strength regulating component;

two probes of the voltage measuring component are configured to be positioned at an input port and an output port of a target rapid shutdown device respectively and the coupling device is configured to communicate with the target rapid shutdown device, for the tester to test the target rapid shutdown device; and the coupling device is configured to communicate with a target rapid shutdown module for the tester to control rapid shutdown devices, wherein the target rapid shutdown device is one of the rapid shutdown devices in the target rapid shutdown module, wherein the main control chip is configured to control the target rapid shutdown device and the target rapid shutdown module through the method according to claim 1.

11. The method according to claim 1, wherein the rapid shutdown devices in the target rapid shutdown module are sequentially determined as the target rapid shutdown device for the testing.

* * * * *